United States Patent
Yao

(10) Patent No.: US 11,566,340 B2
(45) Date of Patent: Jan. 31, 2023

(54) PREPARATION METHOD OF COATING MATERIAL, COATING MATERIAL, CATALYST AND THREE-WAY CATALYTIC CONVERTER

(71) Applicant: BOE Technology Group Co., Ltd., Beijing (CN)

(72) Inventor: Hongbao Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 260 days.

(21) Appl. No.: 16/833,756

(22) Filed: Mar. 30, 2020

(65) Prior Publication Data

US 2021/0095390 A1    Apr. 1, 2021

(30) Foreign Application Priority Data

Sep. 30, 2019  (CN) .......................... 201910944169.5

(51) Int. Cl.
| | | |
|---|---|---|
| *C30B 7/10* | (2006.01) | |
| *B01J 37/02* | (2006.01) | |
| *C30B 29/34* | (2006.01) | |
| *F01N 3/28* | (2006.01) | |
| *C30B 33/02* | (2006.01) | |
| *C09D 1/00* | (2006.01) | |
| *F01N 3/10* | (2006.01) | |

(52) U.S. Cl.
CPC ............. *C30B 7/10* (2013.01); *B01J 37/0221* (2013.01); *C30B 29/34* (2013.01); *C30B 33/02* (2013.01); *F01N 3/2803* (2013.01); *C09D 1/00* (2013.01); *F01N 3/101* (2013.01)

(58) Field of Classification Search
CPC . C30B 7/10; C30B 29/34; C30B 33/02; B01J 37/0221; F01N 3/2803
See application file for complete search history.

(56) References Cited

U.S. PATENT DOCUMENTS

2003/0229125 A1   12/2003   Haaf et al.

FOREIGN PATENT DOCUMENTS

| CN | 1520407 | A |   | 8/2004 |
|---|---|---|---|---|
| CN | 101767792 | A | * | 7/2010 |
| CN | 101767792 | A |   | 7/2010 |
| CN | 101857462 | A |   | 10/2010 |
| CN | 101249459 | B |   | 11/2010 |
| CN | 101947456 | A |   | 1/2011 |
| CN | 105536781 | A |   | 5/2016 |
| CN | 105833899 | A |   | 8/2016 |
| CN | 106902798 | A | * | 6/2017 |
| CN | 106902798 | A |   | 6/2017 |
| CN | 109731609 | A |   | 5/2019 |
| EP | 2269733 | A1 |   | 1/2011 |

OTHER PUBLICATIONS

Shirosaki et al., J of Ceramic Soc of Japan, (2012), 120(11), p. 520-524.*
M Perez-Page et al., Advanced in colloid and interface science, (2016), v234, p. 51-79.*
Jiang et al., J of Inorg. Mater., (2004), 19(3), 634-640 (disclosed in IDS).*
First office action of Chinese application No. 201910944169.5 dated Dec. 29, 2021.
Pingping Jiang et al., Preparation and Properties of Washcoats for Three Way Catalyst; Journal of Inorganic Materials vol. 19, No. 3; May 31, 2004, Introduction.

* cited by examiner

*Primary Examiner* — Yong L Chu
(74) *Attorney, Agent, or Firm* — Fay Sharpe LLP

(57) ABSTRACT

Provided is a preparation method of a coating material. The method includes: using an aluminum salt and a silicon source as precursors; and performing hydrothermal crystallization and calcination treatments successively under an action of a template agent to obtain the coating material, wherein the template agent is used to cause the coating material to form a porous spherical structure. In the embodiments of the present disclosure, the preparation process of the coating material is simple and the cost is low, and the specific surface area of the prepared coating material is large.

11 Claims, 4 Drawing Sheets

PREPARATION METHOD OF COATING MATERIAL, COATING MATERIAL, CATALYST AND THREE-WAY CATALYTIC CONVERTER

CROSS-REFERENCE TO RELATED APPLICATION

The present application claims priority to Chinese Patent Application No. 201910944169.5, filed on Sep. 30, 2019 and entitled "PREPARATION METHOD OF COATING MATERIAL, COATING MATERIAL, CATALYST AND THREE-WAY CATALYTIC CONVERTER", the entire contents of which are incorporated herein by reference.

TECHNICAL FIELD

The present disclosure relates to the field of catalyst converter technologies, and more particularly to a preparation method of a coating material, a coating material, a catalyst and a three-way catalytic converter.

BACKGROUND

For treating the exhaust gases of a motor vehicle, a three-way catalytic converter is usually installed at the outlet of the exhaust pipe to convert the harmful exhaust gases into harmless gases catalytically. The three-way catalytic converter includes a monolithic catalyst with cordierite honeycomb ceramics as a carrier. Due to the small specific surface area of the carrier (<1 $m^2$/g), a coating material with a large specific surface area is required to be coated to disperse and stabilize the catalytic active components, thereby increasing the catalytic area of the catalytic active components and improving the treatment efficiency of the exhaust gases. Therefore, it is necessary to provide a coating material.

SUMMARY

Various embodiments of the present disclosure provide a preparation method of a coating material, a coating material, a catalyst and a three-way catalytic converter, so as to solve the problem that the existing coating material has a complicated preparation process and a low specific surface area.

According to one aspect of the present disclosure, a preparation method of a coating material is provided, wherein the method includes: using an aluminum salt and a silicon source as precursors; and performing hydrothermal crystallization and calcination treatments successively under an action of a template agent to obtain the coating material, wherein the template agent is used to cause the coating material to form a porous spherical structure.

Optionally, the method includes:
mixing an aluminum salt solution, the silicon source, and the template agent to obtain a silicon aluminum composite solution;
performing the hydrothermal crystallization treatment on the silicon aluminum composite solution to obtain a spherical solid product; and
performing the calcination treatment on the solid product to remove the template agent in the solid product, so as to obtain the porous spherical coating material.

Optionally, the method further includes adjusting a pH of the silicon aluminum composite solution to a set range.

Optionally, the pH of the silicon aluminum composite solution ranges from 1 to 3.

Optionally, the method further includes adjusting a pH of the silicon aluminum composite solution and stirring the silicon aluminum composite solution.

Optionally, the silicon source is a liquid organic silicon source, and is mixed, in a dropwise manner, with a solution containing the template agent and the aluminum salt.

Optionally, the silicon source is at least one selected from a group consisting of tetraethyl orthosilicate, tetramethyl orthosilicate and tetraisopropyl orthosilicate.

Optionally, the performing the hydrothermal crystallization treatment on the silicon aluminum composite solution to obtain the spherical solid product includes:
performing the hydrothermal crystallization treatment on the silicon aluminum composite solution to obtain a solid-liquid mixture; and
performing suction filtration and washing treatments on the solid-liquid mixture to obtain the spherical solid product.

Optionally, the hydrothermal crystallization treatment is performed in a hydrothermal reactor under a temperature between 100° C. and 200° C. with a duration between 6 hours and 24 hours.

Optionally, a mass ratio of the aluminum salt, the template agent and the silicon source is 1:0.2 to 3:1.5 to 20.

Optionally, a temperature of the calcination treatment is between 450° C. and 800° C., and a duration of the calcination treatment is between 4 hours and 10 hours.

Optionally, the template agent includes polyvinyl alcohol and methyl cellulose.

Optionally, the method includes:
dissolving polyvinyl alcohol into the aluminum salt solution and stirring until the polyvinyl alcohol is dissolved; and
adding methyl cellulose and stirring until the methyl cellulose is dissolved to obtain a solution containing the template agent and the aluminum salt.

Optionally, a mass ratio of the polyvinyl alcohol to the methyl cellulose is 0.1 to 2:1.

According to another aspect of the present disclosure, a coating material is provided, wherein the coating material is a silicon-aluminum oxide composite with a porous spherical structure.

Optionally, the coating material has a primary particle diameter ranging from 2 μm to 6 μm, and a specific surface area greater than 200 m2/g.

According to yet another aspect of the present disclosure, a catalyst is provided, wherein the catalyst includes a carrier and a coating coated on the carrier, wherein the coating includes any of the above coating materials.

According to still another aspect of the present disclosure, a three-way catalytic converter is provided, wherein three-way catalytic converter includes the above catalyst.

According to yet still another aspect of the present disclosure, a vehicle exhaust treatment system is provided, wherein the system includes the three-way catalytic converter.

According to yet another aspect of the present disclosure, a vehicle exhaust treatment method is provided, wherein the method includes placing the above three-way catalytic converter in an exhaust pipe of an engine.

BRIEF DESCRIPTION OF THE DRAWINGS

In order to describe the technical solutions in the embodiments of the present more clearly, a brief introduction on the accompanying drawings required for describing the embodiments is made as follows. Apparently, the accompanying drawings as described below show merely some embodiments of the present disclosure, and one person of ordinary skill in the art may also derive other drawings from these accompanying drawings without creative efforts.

DETAILED DESCRIPTION

The present disclosure will be described in further detail with reference to the accompanying drawings and some specific embodiments, to present the objects, features, and advantages of the present disclosure more clearly and understandably.

In the related art, when preparing a coating material, in order to increase the specific surface area, it is usually necessary to add different kinds of rare earth materials as additives, which not only makes the preparation cost of the coating material higher, but also makes the preparation process more complicated. Even so, the specific surface area of the coating material prepared in the related art is still relatively low, usually between 50 $m^2/g$ and 200 $m^2/g$.

Some embodiments of the present disclosure provide a preparation method of a coating material with a high specific surface area. The preparation method includes: using an aluminum salt and a silicon source as precursors and performing hydrothermal crystallization and calcination treatments successively under the action of a template agent to obtain the coating material, wherein the template agent is used to cause the coating material to form a porous spherical structure.

In the preparation method of the coating material provided in the embodiments of the present disclosure, aluminum salt and the silicon source are used as precursors and subjected to the hydrothermal crystallization treatment; under the action of a template agent, precursor precipitated particles with a spherical structure can be formed; after the calcination treatment, the template agent is removed from the precursor precipitated particles so as to form a porous structure; as a result, a coating material with a porous spherical structure which is a silicon-aluminum oxide composite is obtained. Here, the silicon source can disperse the aluminum oxide in the coating material, and the template agent can lead to the porous spherical structure of the coating material. These all help to effectively increase the specific surface area of the coating material. In addition, by employing the hydrothermal crystallization treatment and the calcination treatment as main preparation steps, the preparation method of the coating material is simple, easy to operate, and low in cost.

It can be appreciated that the coating materials prepared in the embodiments of the present disclosure have a microsphere structure, and is in a form of powdery particles when viewed by naked eyes.

The specific steps of the preparation method of the coating material provided in some embodiments of the present disclosure are described as follows in combination with some specific examples:

Embodiment I

Figure 1:
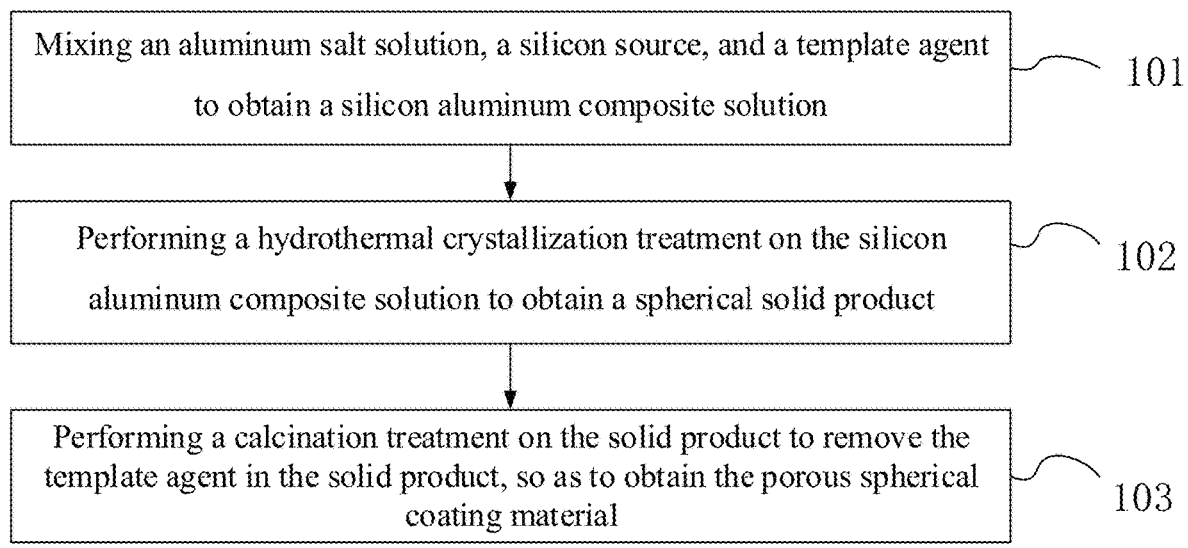
FIG. 1 is a flowchart of a preparation method of a coating material provided in an exemplary embodiment of the present disclosure.

Reference is made to FIG. 1 which shows a flowchart of a preparation method of a coating material according to Embodiment I of the present disclosure.

The preparation method provided in some embodiments of the present disclosure may include the following steps.

In step 101, an aluminum salt solution, a silicon source, and a template agent are mixed to obtain a silicon aluminum composite solution.

In step 102, a hydrothermal crystallization treatment is performed on the silicon aluminum composite solution to obtain a spherical solid product.

In step 103, a calcination treatment is performed on the solid product to remove the template agent in the solid product, so as to obtain the porous spherical coating material.

In step 101, the mixing the aluminum salt solution, the silicon source, and the template agent to obtain the silicon aluminum composite solution may further include the following manners:

in a first manner, the silicon source is mixed with an aluminum salt solution containing the template agent, to obtain the silicon aluminum composite solution;

in a second manner, the aluminum salt solution is mixed with a mixture of the silicon source and the template agent, to obtain the silicon aluminum composite solution; and in a third manner, the aluminum salt solution, the silicon source, and the template agent are mixed simultaneously to obtain the silicon aluminum composite solution.

In order to improve the degree of dispersion of the silicon source in the silicon aluminum composite solution, the manner in which the silicon source is mixed with the aluminum salt solution containing the template agent can be adopted, and by taking this manner as an example, exemplary descriptions on the preparation method of the coating material are given as follows.

Figure 2:
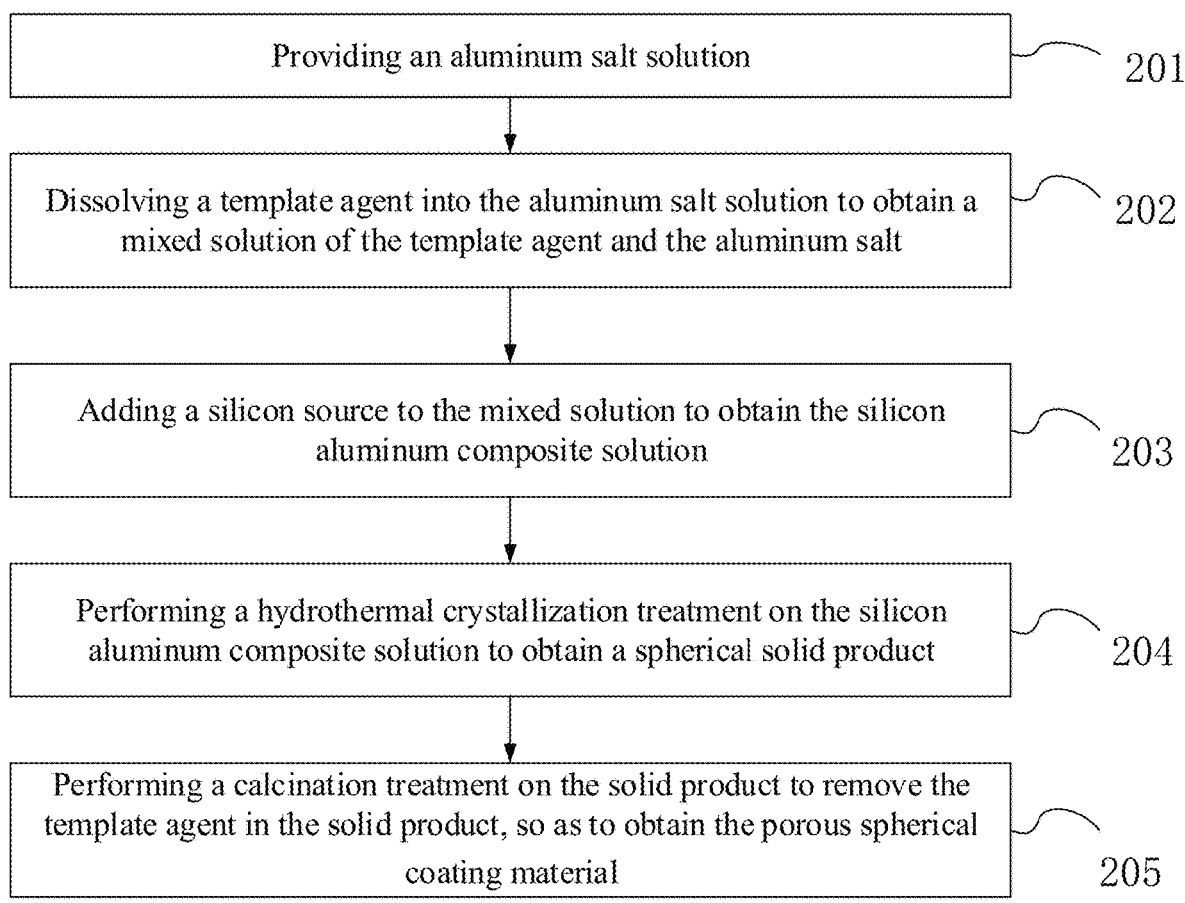
FIG. 2 is a flowchart of a preparation method of a coating material provided in another exemplary embodiment of the present disclosure.

Referring to FIG. 2, the preparation method of the coating material provided in some embodiments of the present disclosure may include the following steps.

In step 201, an aluminum salt solution is provided.

In step 202, a template agent is dissolved in the aluminum salt solution to obtain a mixed solution of the template agent and the aluminum salt.

In step 203, a silicon source is added to the mixed solution to obtain the silicon aluminum composite solution.

In step 204, a hydrothermal crystallization treatment is performed on the silicon aluminum composite solution to obtain a spherical solid product.

In step 205, a calcination treatment is performed on the solid product and the template agent in the solid product is removed to obtain the porous spherical coating material.

The aluminum salt solution which is mentioned in the above steps may be obtained by dissolving the aluminum salt in a solvent.

In some embodiments of the present disclosure, the aluminum salt may be dissolved. In order to improve the purity of the prepared coating material, deionized water may be used to dissolve the aluminum salt.

In an embodiment, the aluminum salt may be a soluble aluminum salt, wherein the soluble aluminum salt may be a soluble ionic compound which belongs to an inorganic aluminum salt. For example, aluminum chloride, aluminum nitrate, and aluminum sulfate or the like can be applicable.

It can be understood that, in an embodiment of the present disclosure, one or more soluble aluminum salts such as aluminum chloride, aluminum nitrate and aluminum sulfate may be dissolved in deionized water to obtain the aluminum salt solution.

As an example, aluminum chloride may be dissolved in water to obtain the aluminum salt solution.

As another example, aluminum chloride, aluminum nitrate and aluminum sulfate may be dissolved in water to obtain the aluminum salt solution.

In some embodiments of the present disclosure, the mass ratio of the aluminum salt to the deionized water may be 1:8 to 50. For example, the mass ratio may be 1:10, 1:15, 1:20, 1:25, 1:30, 1:35, 1:40, 1:45, 1:50 or the like For example, the aluminum salt solution may be obtained by adding and dissolving 12.5 grams of aluminum chloride to 100 grams of deionized water and performing, or adding and dissolving 8 grams of aluminum chloride to 100 grams of deionized water.

For step 202, the template agent is dissolved in the aluminum salt solution to obtain a mixed solution of the template agent and the aluminum salt.

In some embodiments of the present disclosure, the template agent may be dissolved in the aluminum salt solution to obtain a mixed solution of the template agent and the aluminum salt. The template agent can guide the aluminum salt and the silicon source to form a crystal with a porous spherical structure in the subsequent hydrothermal crystallization process, which facilitates the formation of a crystal with high specific surface area and achieves the purpose of controlling the size of the crystal.

In some embodiments of the present disclosure, the template agent may include polyvinyl alcohol and methyl cellulose. By using a template agent with mixed polyvinyl alcohol and methyl cellulose, it can be ensured that the formed coating material has a microsphere structure and has a plurality of pores, thereby having a high specific surface area.

For the above-mentioned template agent composed of polyvinyl alcohol and methyl cellulose, the dissolving the template agent in the aluminum salt solution to obtain a mixed solution of the template agent and the aluminum salt may include the following sub-steps:

sub-step S11, polyvinyl alcohol is dissolved in the aluminum salt solution and stirring is performed until it is dissolved.

In some embodiments of the present disclosure, polyvinyl alcohol may be added and dissolved in the aluminum salt solution. Through sufficient stirring, the polyvinyl alcohol can be fully dissolved in the aluminum salt solution.

In sub-step S12, adding methyl cellulose and performing stirring until it is dissolved to obtain a mixed solution of the template agent and the aluminum salt, i.e., a mixed solution of polyvinyl alcohol, methyl cellulose and aluminum salt.

In some embodiments of the present disclosure, methyl cellulose may be slowly added to the solution obtained from the sub-step S11, and an adequate stirring is performed until the methyl cellulose is completely dissolved.

In view that the viscosity of methyl cellulose is greater than that of polyvinyl alcohol, by dissolving polyvinyl alcohol before dissolving methyl cellulose, the polyvinyl alcohol and methyl cellulose can be fully dissolved in the aluminum salt solution.

By using polyvinyl alcohol and methyl cellulose as the template agent, and sufficiently dissolving the template agent in the aluminum salt solution, it is advantageous for guiding aluminum salt and silicon source to form a crystal in the subsequent crystallization process.

In order to further improve the template effect of the template agent, the mass ratio of polyvinyl alcohol to methyl cellulose may be 0.1 to 2:1, such as 0.5 to 1:1. For example, the mass ratio of polyvinyl alcohol to methyl cellulose may be 0.3:1, 0.5:1, 0.7:1, 0.9:1, 1:1, 1.5:1, and the like.

In some embodiments of the present disclosure, the mass ratio of the aluminum salt to the template agent may be 1:0.2 to 3, such as 1:0.5, 1:1, 1:1.5, 1:2, 1:2.5 and the like.

When the template agent is a mixture of polyvinyl alcohol and methyl cellulose, the mass ratio of aluminum salt to polyvinyl alcohol may be 1:0.1 to 1, such as 1:0.2 to 0.6, and the mass ratio of aluminum salt and methyl cellulose may be 1:0.1 to 2, such as 1:0.1 to 1.

In step 203, the silicon source is added to the mixed solution to obtain the silicon aluminum composite solution.

In some embodiment of the present disclosure, the silicon source may be added to the mixed solution of the template agent and the aluminum salt which is obtained from step 202, so as to obtain the silicon aluminum composite solution.

The silicon source is used to increase the degree of dispersion of the aluminum salt in the mixed solution, which may further increase the specific surface area of the aluminum oxide in the final product.

Optionally, the silicon source may be a liquid organic silicon source, which may be added to the mixed solution in a dropwise manner, so as to improve the degree of dispersion of the aluminum salt.

The liquid organic silicon source which may be applicable may be at least one selected from a group consisting of tetraethyl orthosilicate, tetramethyl silicate and tetraisopropyl orthosilicate. Here, tetraisopropyl orthosilicate is also known as isopropyl silicate.

As tetraethyl orthosilicate has good hydrolysis performance, the silicon source may be tetraethyl orthosilicate or a mixed solution of tetraethyl orthosilicate and other silicon sources.

Further, the preparation method provided in some embodiments of the present disclosure further includes: adjusting the pH of the silicon aluminum composite solution to a set range, to provide a stable environment for the hydrothermal crystallization reaction. The pH range of the silicon aluminum composite solution may be between 1 and 3.

In some embodiments of the present disclosure, the adding the silicon source to the mixed solution to obtain the silicon aluminum composite solution may include the following sub-steps.

In sub-step S21, the silicon source is added to the mixed solution with a homogeneous stirring.

In some embodiments of the present disclosure, the silicon source may be moved by using a pipette and added to the mixed solution in a dropwise manner with an adequate and homogeneous stirring, so that the silicon source may be fully and uniformly mixed with the aluminum salt and the template agent in the mixed solution to obtain a good dispersion effect.

The mass ratio of the aluminum salt, the template agent and the silicon source may be 1:0.2 to 3:1.5 to 20. For example, when the aluminum salt is 1 part by weight, the template agent may be 0.5 part by weight, 1 part by weight, 1.5 parts by weight, 2 parts by weight or 2.5 parts by weight; and the silicon source may be 1.5 parts by weight, 2 parts by weight, 5 parts by weight, 8 parts by weight, 10 parts by weight, 12 parts by weight, 15 parts by weight, 18 parts by weight, or 20 parts by weight.

In sub-step S22, an acid solution is added to hydrolyze the silicon source, so as to obtain a silicon aluminum composite solution which has a pH value within a preset range.

In some embodiments of the present disclosure, an acid solution may be added to the mixed solution obtained from the sub-step S21 to sufficiently hydrolyze the silicon source, and the pH value of the mixed solution may be adjusted to obtain a silicon aluminum composite solution which has a pH value within a preset range.

For example, the acid solution may be a water-soluble acid, including water-soluble inorganic and organic acids, such as hydrochloric acid, sulfuric acid, nitric acid, phosphoric acid, oxalic acid, acetic acid and the like. The acid solution may be one or more of the above substances.

The range of the above mentioned pH value may be from 1 to 3, which may facilitate the sufficient hydrolysis of the silicon source, as well as the complex reaction between the hydrolyzed silicon source and the aluminum salt, so as to improve the dispersion effect of the silicon source on the aluminum salt.

Some embodiments of the present disclosure may further include adjusting the pH of the silicon aluminum composite solution to a preset range, and after adjusting the pH of the silicon aluminum composite solution to the preset range, stirring the silicon aluminum composite solution for a preset duration in order to improve the dispersion effect.

For example, the silicon aluminum composite solution may be stirred at a low temperature ranging from 10° C. to 25° C. for 8 hours to 12 hours, which facilitates the sufficient hydrolysis of the silicon source, and also facilitates the complex reaction between the hydrolyzed silicon source and the aluminum salt, so as to improve the dispersion effect of the silicon source on the aluminum salt.

In step 204, the hydrothermal crystallization treatment is performed on the silicon aluminum composite solution to obtain a spherical solid product.

In the embodiments of the present disclosure, the hydrothermal crystallization treatment may be performed on the silicon aluminum composite solution under a static high-temperature circumstance (such as in a high-temperature reactor or a hydrothermal reactor). During the hydrothermal crystallization process, due to the effect of the template agent, a spherical solid product with a large specific surface can be formed. Due to the dispersion effect of the silicon source, the volume of the spherical solid product is small (i.e., the particle size is small). In this way, the specific surface area of the spherical solid product can be further increased, and thus the specific surface area of the final product is larger.

In addition, by using a high-temperature reactor or a hydrothermal reactor for performing the hydrothermal crystallization reaction, it is more convenient for batch production and the reaction process is simple and controllable, which may avoid the high temperature reflow operation in the related art and is beneficial for industrial production.

In some embodiments of the present disclosure, the performing the hydrothermal crystallization treatment on the silicon aluminum composite solution to obtain a spherical solid product may include the following sub-steps.

In sub-step S31: the hydrothermal crystallization treatment is performed on the silicon aluminum composite solution to obtain a solid-liquid mixture.

In some embodiments of the present disclosure, the hydrothermal crystallization treatment may be performed by placing the silicon aluminum composite solution under a static high-temperature circumstance (such as in a high-temperature reactor or a hydrothermal reactor), so that the silicon ions and aluminum ions in the silicon aluminum composite solution can fully react to form a silicon oxide and an aluminum oxide, wherein the silicon oxide can be silicon dioxide, and the aluminum oxide may be aluminum oxide. The spherical solid product formed by the silicon oxide and the aluminum oxide together with the template agent is then precipitated to obtain a solid-liquid mixture.

The temperature of the hydrothermal crystallization treatment may be between 100° C. and 200° C., such as 100° C., 120° C., 150° C., 180° C., 200° C. or the like; the duration of hydrothermal crystallization treatment may be between 6 hours and 24 hours, such as 6 hours, 8 hours, 10 hours, 12 hours, 15 hours, 18 hours, 20 hours, 22 hours or the like. In this way, the silicon ions and aluminum ions in the silicon aluminum composite solution can fully react to form a spherical solid product.

After the hydrothermal crystallization treatment is completed, the solid-liquid mixture may be cooled before subsequent operations. For example, the solid-liquid mixture may be cooled at room temperature.

In sub-step S32, suction filtration and washing treatments are performed on the solid-liquid mixture to obtain a spherical solid product.

In some embodiments of the present disclosure, suction filtration and washing treatments may be performed (can be performed for a plurality of times) on the solid-liquid mixture after the solid-liquid mixture is cooled, so as to extract the spherical solid product in the solid-liquid mixture.

It can be understood that the spherical solid product is a spherical powder composed of silicon dioxide, aluminum oxide, and the template agent.

Due to the action of the template agent, the solid product may have a spherical shape and large specific surface area. Moreover, due to the dispersion effect of the silicon source, the volume of the spherical solid product is small. In this way, the specific surface area of the spherical solid product may be further increased.

Further, before the calcination treatment, a drying treatment may be performed on the solid product under a temperature ranging from 60° C. to 100° C. to facilitate the drying and molding of the coating material.

In step 205, the calcination treatment is performed on the solid product to remove the template agent in the solid product, so as to obtain the porous spherical coating material.

Here, the coating material prepared in the embodiments of the present disclosure is a porous silicon-aluminum oxide composite which may include silicon dioxide and aluminum oxide.

In some embodiments of the present disclosure, the calcination treatment may be performed on the spherical solid product to remove the template agent in the solid product, so as to obtain the coating material. Through the calcination treatment, the template agent in the solid product can be oxidized and removed, and only the silicon-aluminum oxide composite, i.e., aluminum oxide and silicon dioxide, is retained. After the template agent is removed, the original position of the template agent in the spherical solid product will form a pore-like gap. In this way, a coating material having a porous structure in the interior can be obtained, and the specific surface area of the coating material can be further increased.

For example, the temperature of the calcination treatment is between 450° C. and 800° C., such as 500° C., 550° C., 600° C., 650° C., 700° C. or the like, and the duration of the calcination treatment is between 4 hours and 10 hours, such as 6 hours, 8 hours, 9 hours, 10 hours or the like, so that not only the template agent in the solid product can be fully calcinated and removed through the calcination treatment, but also the performance of silicon oxide and aluminum oxide in the solid product will not be affected.

It can be understood that the formed coating material is a spherical powdery material, which makes the specific surface area of the coating material large. Moreover, the silicon oxide in the coating material may be used to increase the degree of dispersion of the aluminum oxide and further increase the specific surface area of the coating material. The porous structure formed after the template agent being calcinated can further increase the specific surface area of the coating material. Therefore, the specific surface area of the prepared coating material is relatively large.

By performing a nitrogen gas adsorption-desorption experiment on the coating material prepared in the embodiments of the present disclosure, it can be seen that the specific surface area of the prepared coating material can be up to 908.6 $m^2/g$. When using such coating material to prepare a catalyst in a three-way catalytic converter, due to its large specific surface area, the catalytic area is correspondingly large, which in turn leads to a high catalytic efficiency of the catalyst.

In the embodiments of the present disclosure, the aluminum salt solution is obtained by dissolving aluminum salt; the template agent is dissolved in the aluminum salt solution to obtain a mixed solution of the template agent and aluminum salt; the silicon source is added in the mixed solution to obtain the silicon aluminum composite solution; the hydrothermal crystallization treatment is performed on the silicon aluminum composite solution to obtain a spherical solid product; the calcination treatment is performed on the solid product to remove the template agent in the solid product to obtain the spherical coating material. The coating material is a porous oxide composite which may include silicon dioxide and aluminum oxide. In this way, the use of rare earth materials in the preparation process of the coating material may be avoided, and thus the preparation process is simple and the cost is low. In addition, as the coating material is a spherical powdery material, the specific surface area of the coating material is large. Moreover, the silicon dioxide in the coating material may increase the degree of dispersion of the aluminum oxide and further increase the specific surface area in the coating material. Furthermore, the porous structure in the porous oxide composite that will be formed after the template agent is calcinated may further increase the specific surface area of the coating material. Therefore, the specific surface area of the coating material is large.

Some specific preparation examples are also provided as follows in the embodiment of the present disclosure, to further describe the preparation methods involved in the embodiments of the present disclosure:

Example 1

12.5 grams of aluminum chloride were weighed and then added to 100 grams of deionized water; stirring was performed until it was dissolved; 2 grams of polyvinyl alcohol and 2 grams of methyl cellulose (a mass ratio of 1:1 was maintained) were then added; after an adequate stirring, tetraethyl orthosilicate was added in a dropwise manner following a mass ratio of the aluminum chloride to the silicon source being 1:2.5; stirring was performed until fully dissolved; and then, concentrated hydrochloric acid was added in a dropwise manner to adjust the pH of the reaction system to about 2. Stirring was performed overnight at a temperature of 20° C.; the silicon aluminum composite solution was transferred to the hydrothermal reactor and reacted at 120° C. for 8 hours; the solid reaction product was taken out and dried at 80° C. overnight and then calcinated at 600° C. for 6 hours to obtain the final powdery product, i.e., the coating material prepared in this example.

Example 2

5 grams of aluminum chloride and 3 grams of aluminum nitrate were weighed and then added to 100 grams of deionized water; stirring was performed until dissolved; 1.5 grams of polyvinyl alcohol and 1.5 grams of methyl cellulose (a mass ratio of 1:1 was maintained) were then added; after an adequate stirring, tetramethyl orthosilicate was added in a dropwise manner following a mass ratio of the aluminum salt to the silicon source being 1:2; stirring was performed until fully dissolved; and then, concentrated hydrochloric acid was added in a dropwise manner to adjust the pH of the reaction system to about 2.5. Stirring was performed overnight at a temperature of 20° C.; the silicon aluminum composite solution was transferred to the hydrothermal reactor and reacted at 150° C. for 10 hours; the solid reaction product was taken out and dried at 90° C. overnight and then calcinated at 750° C. for 10 hours to obtain the final powdery product, i.e., the coating material prepared in this example.

Example 3

10 grams of aluminum chloride and 2.5 grams of aluminum sulfate were weighed and then added to 100 grams of deionized water; stirring was performed until it was dissolved; 1 gram of polyvinyl alcohol and 2 grams of methyl cellulose (a mass ratio of 0.5:1 was maintained) were then added; after an adequate stirring, tetraisopropyl orthosilicate was added in a dropwise manner following a mass ratio of the aluminum salt to the silicon source being 1:2.5; stirring was performed until fully dissolved; and then, acetic acid was added in a dropwise manner to adjust the pH of the reaction system to about 2. Stirring was performed overnight at a temperature of 25° C.; the silicon aluminum composite solution was transferred to the hydrothermal reactor and reacted at 100° C. for 24 hours; the solid reaction product was taken out and dried at 100° C. overnight and then calcinated at 800° C. for 4 hours to obtain the final powdery product, i.e., the coating material prepared in this example.

Example 4

10 grams of aluminum chloride were weighed and then added to 100 grams of deionized water; stirring was performed until it was dissolved; 2 grams of polyvinyl alcohol and 2 grams of methyl cellulose (a mass ratio of 1:1 was maintained) were then added; after an adequate stirring, tetraethyl orthosilicate was added in a dropwise manner following a mass ratio of the aluminum chloride to the silicon source being 1:5; stirring was performed until fully dissolved; and then, concentrated hydrochloric acid was added in a dropwise manner to adjust the pH of the reaction system to about 2. Stirring was performed overnight at a temperature of 20° C.; the silicon aluminum composite solution was transferred to the hydrothermal reactor and reacted at 200° C. for 6 hours; the solid reaction product was taken out and dried at 80° C. overnight and then calcinated at 700° C. for 8 hours to obtain the final powdery product, i.e., the coating material prepared in this example.

Example 5

12.5 grams of aluminum nitrate were weighed and then added to 100 grams of deionized water; stirring was performed until it was dissolved; 2 grams of polyvinyl alcohol and 2 grams of methyl cellulose (a mass ratio of 1:1 was maintained) were then added; after an adequate stirring, tetraethyl orthosilicate was added in a dropwise manner following a mass ratio of the aluminum nitrate to the silicon source being 1:2.5; stirring was performed until fully dissolved; and then, concentrated hydrochloric acid was added in a dropwise manner to adjust the pH of the reaction system to about 3. Stirring was performed overnight at a temperature of 15° C.; the silicon aluminum composite solution was transferred to the hydrothermal reactor and reacted at 180° C. for 8 hours; the solid reaction product was taken out and dried at 80° C. overnight and then calcinated at 600° C. for 8 hours to obtain the final powdery product.

Example 6

12.5 grams of aluminum chloride were weighed and then added to 100 grams of deionized water; stirring was performed until it was dissolved; 1.6 grams of polyvinyl alcohol and 2 grams of methyl cellulose (a mass ratio of 0.8:1 was maintained) were then added; after an adequate stirring, tetraethyl orthosilicate was added in a dropwise manner following a mass ratio of the aluminum chloride to the silicon source being 1:6; stirring was performed until fully dissolved; and then, concentrated hydrochloric acid was added in a dropwise manner to adjust the pH of the reaction system to about 2. Stirring was performed overnight at a temperature of 20° C.; the silicon aluminum composite solution was transferred to the hydrothermal reactor and reacted at 150° C. for 8 hours; the solid reaction product was taken out and dried at 80° C. overnight and then calcinated at 600° C. for 6 hours to obtain the final powdery product, i.e., the coating material prepared in this example.

Figure 3:
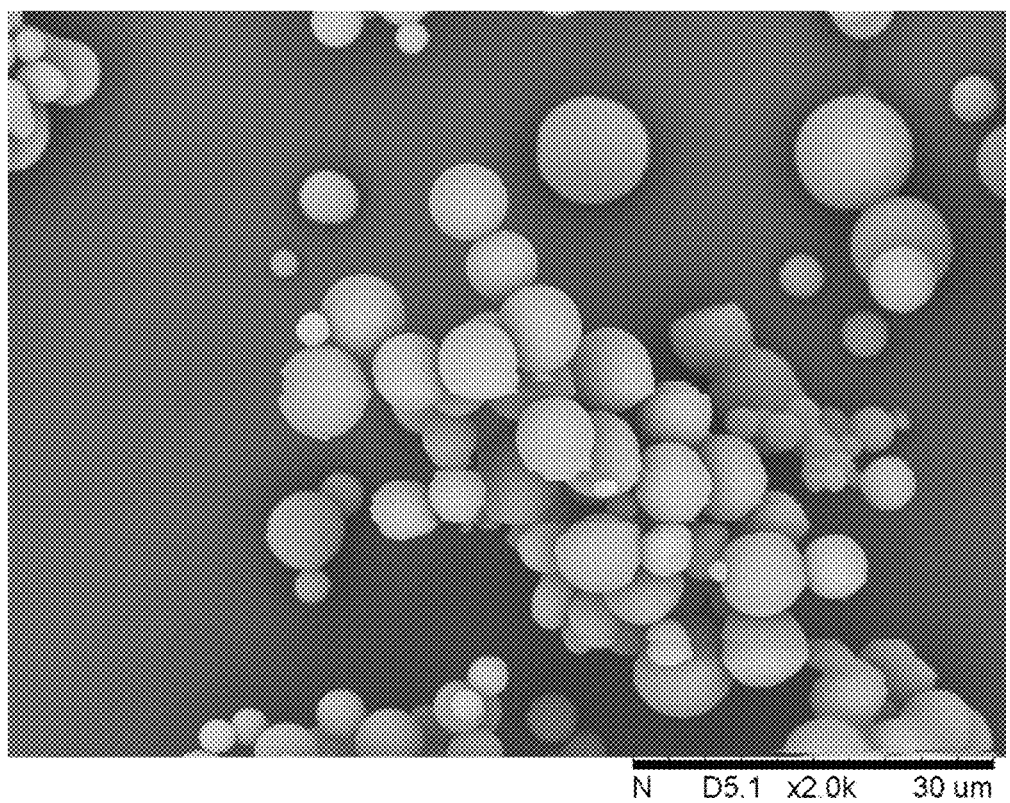
FIG. 3 is a scanning electron microscope photograph of a coating material provided in an exemplary embodiment of the present disclosure.

The coating material prepared in Example 1 was subjected to scanning electron microscope (SEM), and an SEM photograph was obtained, shown in FIG. 3. It may be seen that the micro-structure of the coating material prepared in Example 1 is microspheres with particle sizes ranging from 2 μm to 6 μm.

Figure 4:
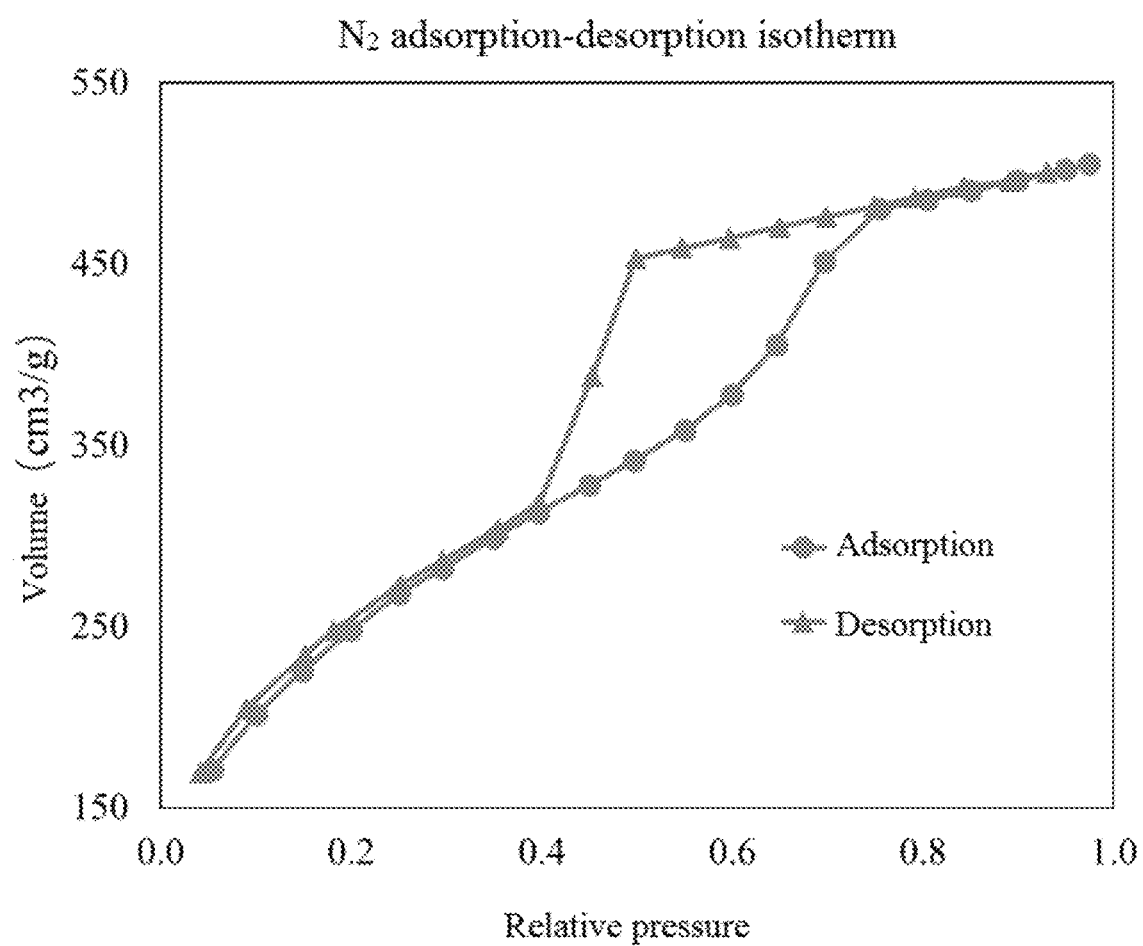
FIG. 4 is a diagram showing the result of nitrogen gas adsorption-desorption experiment of a coating material provided in an exemplary embodiment of the present disclosure.

By performing a nitrogen gas adsorption-desorption test on the coating material prepared in Example 1, the obtained characterization results are shown in FIG. 4. By calculating the data shown in FIG. 4, it can be determined that the specific surface area of the coating material prepared in Example 1 is as high as 908.6 m$^2$/g.

For the sake of simple description, method embodiments are expressed as a series of combinations of actions. However, those skilled in the art should be aware that the present disclosure is not limited by the sequence of actions described, as certain steps may be performed in other sequences or simultaneously in accordance with the present disclosure. Moreover, those skilled in the art should also be aware that the embodiments described in the specification are all optional embodiments, and the actions and modules involved may be not necessarily required for the present disclosure.

Embodiment II

In some embodiments of the present disclosure, a coating material which is prepared by the above-mentioned preparation method of the coating material is further provided.

Here, the coating material is a silicon-aluminum oxide composite having a porous spherical structure, wherein the oxide composite may include silicon dioxide and aluminum oxide.

Reference is made to FIG. 3 which shows a scanning electron microscope (SEM) photograph of a coating material in Embodiment II of the present disclosure. As shown in FIG. 3, the coating material is in a microsphere structure.

The coating material prepared in the embodiment of the present disclosure has a primary particle diameter ranging from 2 μm to 6 μm, and a specific surface area greater than 200 m$^2$/g, and the specific surface area may be up to 908.6 m$^2$/g.

It can be seen that, in the embodiments of the present disclosure, the coating material is a spherical powdery material, so that the specific surface area of the coating material is large. Moreover, the silicon dioxide in the coating material can be used to increase the degree of dispersion of the aluminum oxide, which can further increase the specific surface area of the coating material. Furthermore, the porous structure in the coating material can also further increase the specific surface area of the coating material. Therefore, the specific surface area of the coating material is large.

Embodiment III

In some embodiments of the present disclosure, a catalyst including a carrier and a coating coated thereon is provided, wherein the coating includes the coating material provided in some embodiments of the present disclosure.

The carrier in the catalyst may be a ceramic honeycomb carrier, a metal honeycomb carrier, a SiC foam ceramic carrier or the like, and the porosity may be from 30% to 70%, for example, from 40% to 60%, or from 40% to 50%.

For example, ceramic honeycomb carriers include but are not limited to cordierite honeycomb ceramic carriers, aluminum titanate honeycomb ceramic carriers, silicon carbide honeycomb ceramic carriers, silicon nitride honeycomb ceramic carriers, polyaluminum-andalusite honeycomb ceramic carriers, alkaline and alkaline earth feldspar and the like.

Metal honeycomb carriers include but are not limited to Fe—Cr—Al alloy honeycomb carriers, Ni—Cr alloy honeycomb carriers, Fe—Mo—W alloy honeycomb carriers, and the like.

When forming a coating on a carrier, the coating material provided in the embodiments of the present disclosure may be coated on the carrier by spray-coating, brush-coating or dip-coating. In order to coating the coating material fully and evenly on the inner and outer surfaces of the carrier, a dip-coating method may be adopted in some embodiments of the present disclosure.

For example, the coating material provided in the embodiments of the present disclosure may be dissolved in a dispersion solvent, such as deionized water, and be stirred to form a suspension. By dipping the carrier into the suspension containing the coating material for a preset period (for example, 1-10 minutes, and dipping may be performed for several times); then slowly lifting the carrier from the suspension until it is fully exposed; using air to blow away the excess residual liquid in the pore channels; and drying and calcinating the carrier, a coated carrier can be obtained. The above drying process may be performed by placing the carrier in an oven under a temperature ranging from 80° C. to 200° C. The above calcinating process may be performed by calcinating the dried carrier in a muffle furnace under a temperature ranging from 400° C. to 600° C.

Further, the active component of the catalyst may be dissolved in a dispersion solvent to form a suspension. By coating (for instance, by dip-coating) the suspension on the carrier on which the coating material has been coated, after the drying and calcinating processes, the catalyst described in the embodiments of the present disclosure can be obtained. Alternatively, the active component of the catalyst, together with the coating material, may be dissolved in a solvent and coated on the carrier, and after the above-mentioned drying and calcinating processes, the catalyst can be obtained.

In the embodiments of the present disclosure, the coating material is a spherical powdery material, and the specific surface area of the coating material is relatively large. Moreover, the silicon dioxide in the coating material may increase the degree of dispersion of the aluminum oxide and further increase the specific surface area of the coating material. Furthermore, the porous structure in the coating material may further increase the specific surface area of the coating material. Therefore, the specific surface area of the coating material is large. Therefore, the catalytic area of the coating made of the coating material is relatively large, and the catalytic efficiency of the catalyst is high.

Embodiment IV

Some embodiments of the present disclosure also discloses a three-way catalytic converter which may include the above-mentioned catalyst.

The structure of the three-way catalytic converter is commonly known in the art and at least includes a housing and a catalyst, wherein the housing has an accommodating cavity, and an air inlet and an air outlet which are communicating with the accommodating cavity, and the catalyst is filled in the accommodating cavity.

For example, such a three-way catalytic converter may be provided, which includes: an inlet flange, an inlet pipe, an inlet end cover, a housing, an outlet end cover and an outlet flange that are successively connected, wherein an accommodating cavity is located within the housing and a catalyst is encapsulated within the accommodating cavity. Further, a shock absorption layer may be provided on an inner wall of the housing, and a heat shield may be provided on an outer wall of the housing.

When the three-way catalytic converter is manufactured, the catalyst can be filled within the accommodating cavity of the housing, and then the housing is assembled and connected with other components by welding or the like.

The catalytic activity of the three-way catalytic converter can be tested with the simulated exhaust gas mixture, wherein the simulated exhaust gas mixture may include the following components (in volume percentage): 0.77% $O_2$, 14% $CO_2$, 0.33% $H_2$, 0.0333% $C_3H_6$, 0.0167% $C_3H_8$, 1% CO, 0.1% NO, 0.0023% $SO_2$, 10% $H_2O$, and balance nitrogen. During the test, the air speed of the catalytic reaction is maintained at 50,000 $hr^{-1}$. The temperature of the three-way catalytic converter is increased at a rate of 1° C./min until the final temperature reaches 600° C.; the oxygen concentration is kept constant, so that the redox ratio of the gas stream is maintained at 1.095 during the whole test process, so as to achieve the purpose of measuring the catalytic activity of the catalyst. Specifically, the temperature at which CO, NOx, and hydrocarbons all reach a conversion rate of 50%, i.e., the ignition temperature of the catalyst for various poisonous gases, is measured. It has been tested that the ignition temperature of the catalyst loaded in the three-way catalytic converter provided in the embodiments of the present disclosure for the toxic gas is lower than 200° C. This means that the catalyst has good catalytic activity, and the three-way catalyst converter has a high efficiency.

In the embodiments of the present disclosure, as the coating material is a spherical powdery material, the specific surface area of the coating material is large. Moreover, the silicon dioxide in the coating material helps to increase the degree of dispersion of the aluminum oxide, thereby further increasing the specific surface area of the coating material. Furthermore, the porous structure in the coating material also further increases the specific surface area of the coating material. Therefore, the specific surface area of the coating material is large. As such, the catalytic area of the coating made of the coating material is relatively large, and the catalytic efficiency of the catalyst is relatively high. Therefore, the catalytic efficiency of the three-way catalytic converter including the catalyst is relatively high.

Embodiment V

In some embodiments of the present disclosure, a vehicle exhaust gas treatment system is further provided, wherein the vehicle exhaust gas treatment system includes the above-mentioned three-way catalytic converter.

For example, the vehicle exhaust gas treatment system may include a three-way catalytic converter, a condensation separation device, and a collection device. The three-way catalytic converter is coupled to the condensation separation device to perform a catalytic reduction reaction between the exhaust gas discharged from the exhaust pipe and the reducing agent, and transfer the gas subjected to the catalytic reduction reaction into the condensation separation device. The condensation separation device is connected with another exhaust pipe and is also coupled with the three-way catalytic converter, and condenses the water vapor and ammonia gas in the gas from the three-way catalytic converter after the catalytic reduction reaction to obtain ammonia water and separates the obtained solution which contains ammonia water. The collection device is configured for collecting the ammonia water separated by the condensation separation device.

In the embodiments of the present disclosure, as the coating material of the catalyst in the three-way catalytic converter is a spherical powdery material, the specific surface area of the coating material is large. Moreover, the silicon dioxide in the coating material may further increase the degree of dispersion of the aluminum oxide and further increase the specific surface area of the coating material. The porous structure in the coating material may further increase the specific surface area of the coating material. Therefore, the specific surface area of the coating material is large. As such, the catalytic area of the coating made of the coating material is relatively large, and the catalytic efficiency of the catalyst is relatively high. Therefore, the catalytic efficiency of the three-way catalytic converter including the catalyst is relatively high, so that the treatment efficiency of the vehicle exhaust gas treatment system on the toxic gas is relatively high.

Embodiment VI

In some embodiments of the present disclosure, a vehicle exhaust gas treatment method is provided, wherein the vehicle exhaust gas treatment method includes arranging the three-way catalytic converter in the exhaust pipe of the engine.

For example, by arranging the three-way catalytic converter in the exhaust pipe of the engine of the vehicle to couple with the condensation separation device mentioned in Embodiment V, the exhaust gas can be processed through the three-way catalytic converter, so that the purpose of converting harmful gases such as CO, hydrocarbon (HC) and NOx in the vehicle exhaust gas into harmless carbon dioxide, water and nitrogen through oxidation and reduction can be achieved.

The various embodiments in the specification are described in a progressive manner, each embodiment merely focuses on the differences from the other embodiments, and the same or similar parts among the various embodiments can be referred to one another.

Finally, it should be noted that, as used herein, relation terms such as "first" and "second" are used merely to distinguish a subject or an operation from another subject or another operation, and not to imply any substantial relation or order between these subjects or operations. Moreover, the term "include", "comprise" or any other variants thereof is intended to cover non-exclusive including, such that the process, method, article, or device including a plurality of elements includes not only those elements but also other elements that are not explicitly listed, or also includes the elements that are inherent to such a process, method, item, or device. Without more limitations, the element defined by the phrase "including a . . . " does not exclude the presence of additional equivalent elements in the process, method, item, or device that includes the element.

The preparation method of a coating material, the coating material, the catalyst, and the three-way catalytic converter provided by the present disclosure have been described in detail above. Specific examples are used herein to explain the principles and implementations of the present disclosure. The description of the above embodiments is only used to help understand the method and the core ideas of the present disclosure. Meanwhile, for those of ordinary skill in the art, there will be changes in the specific implementation and application scope according to the idea of the present disclosure. In summary, the content of this specification should not be construed as a limitation on the present disclosure.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A preparation method of a coating material, comprising:
   mixing an aluminum salt solution, a silicon source, and a template agent to obtain a silicon aluminum composite solution, wherein a pH of the silicon aluminum composite solution ranges from 1 to 3;
   using an aluminum salt and the silicon source as precursors; and
   performing hydrothermal crystallization and calcination treatments successively under an action of the template agent to obtain the coating material, wherein the hydrothermal crystallization treatment is performed in a hydrothermal reactor with a duration between 6 hours and 24 hours;
   comprises polyvinyl alcohol and methyl cellulose, and is used to cause the coating material to form a porous spherical structure.

2. The method according to claim 1, wherein the method comprises:
   performing the hydrothermal crystallization treatment on the silicon aluminum composite solution to obtain a spherical solid product; and
   performing the calcination treatment on the solid product to remove the template agent in the solid product, so as to obtain the porous spherical coating material.

3. The method according to claim 1, further comprising:
   adjusting the pH of the silicon aluminum composite solution and stirring the silicon aluminum composite solution.

4. The method according to claim 1, wherein the silicon source is a liquid organic silicon source, and is mixed, in a dropwise manner, with a solution containing the template agent and the aluminum salt.

5. The method according to claim 4, wherein the silicon source is at least one selected from a group consisting of tetraethyl orthosilicate, tetramethyl orthosilicate and tetraisopropyl orthosilicate.

6. The method according to claim 2, wherein performing the hydrothermal crystallization treatment on the silicon aluminum composite solution to obtain the spherical solid product comprises:
   performing the hydrothermal crystallization treatment on the silicon aluminum composite solution to obtain a solid-liquid mixture; and
   performing suction filtration and washing treatments on the solid-liquid mixture to obtain the spherical solid product.

7. The method according to claim 1, wherein the hydrothermal crystallization treatment is performed in the hydrothermal reactor under a temperature between 100° C. and 200° C.

8. The method according to claim 1, wherein a mass ratio of the aluminum salt, the template agent and the silicon source is 1:0.2 to 3:1.5 to 20.

9. The method according to claim 1, wherein a temperature of the calcination treatment is between 450° C. and 800° C., and a duration of the calcination treatment is between 4 hours and 10 hours.

10. The method according to claim 1, wherein the method comprises:
    dissolving polyvinyl alcohol into the aluminum salt solution and stirring until the polyvinyl alcohol is dissolved; and
    adding methyl cellulose and stirring until the methyl cellulose is dissolved to obtain a solution containing the template agent and the aluminum salt.

11. The method according to claim 1, wherein a mass ratio of the polyvinyl alcohol to the methyl cellulose is 0.1 to 2:1.

* * * * *